(12) United States Patent
Ueda et al.

(10) Patent No.: US 8,003,975 B2
(45) Date of Patent: Aug. 23, 2011

(54) SEMICONDUCTOR INTEGRATED CIRCUIT DEVICE AND METHOD FOR FABRICATING THE SAME

(75) Inventors: Tetsuzo Ueda, Osaka (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 559 days.

(21) Appl. No.: 11/600,101

(22) Filed: Nov. 16, 2006

(65) Prior Publication Data

US 2007/0114589 A1    May 24, 2007

(30) Foreign Application Priority Data

Nov. 18, 2005   (JP) ................................ 2005-333860

(51) Int. Cl.
     *H01L 31/00*        (2006.01)
(52) U.S. Cl. .................. 257/20; 257/758; 257/E27.046; 257/192
(58) Field of Classification Search .................. 257/341, 257/194, 192, 280, E27.046; 438/162
See application file for complete search history.

(56) References Cited

U.S. PATENT DOCUMENTS

| | | | | |
|---|---|---|---|---|
| 5,081,706 | A * | 1/1992 | Kim ................................ | 455/78 |
| 6,476,431 | B1 * | 11/2002 | Ohno et al. .................... | 257/280 |
| 7,052,942 | B1 * | 5/2006 | Smart et al. .................... | 438/162 |
| 2004/0070003 | A1 * | 4/2004 | Gaska et al. .................... | 257/192 |
| 2005/0001235 | A1 * | 1/2005 | Murata et al. .................. | 257/192 |
| 2005/0274980 | A1 * | 12/2005 | Miyoshi ......................... | 257/192 |
| 2006/0208279 | A1 * | 9/2006 | Robinson et al. ............. | 257/194 |
| 2006/0226477 | A1 * | 10/2006 | Brar et al. ...................... | 257/341 |
| 2006/0226478 | A1 * | 10/2006 | Brar et al. ...................... | 257/341 |

FOREIGN PATENT DOCUMENTS

| | | |
|---|---|---|
| JP | 2002-26270 | 1/2002 |
| JP | 2004-363563 | 12/2004 |

OTHER PUBLICATIONS

T. Murata et al., IEEE Trans. Electron Devices, 52 (2005) 1042 "Source Resistance Reduction of AlGaN—GaN HFETs with Novel Superlattice Cap Layer".
M. Higashiwaki et al., Jpn. J.Appl. Phys., 44 (2005) L475, "AlGaN/GaN Heterostructure Field-Effect Transistors with Current Gain Cut-off Frequency of 152 GHz on Sapphire Substrates".
M. Nishijima et al., 2005 IEEE MTT-S IMS Digest, Session TU4B, "A K-band AlGaN/GaN HFET MMIC Amplifier on Sapphire using novel superlattice cap layer".

* cited by examiner

*Primary Examiner* — Matthew E Warren
*Assistant Examiner* — Fang-Xing Jiang
(74) *Attorney, Agent, or Firm* — McDermott Will & Emery LLP

(57) ABSTRACT

A semiconductor integrated circuit device includes: a semiconductor layer having a principal surface on which a source electrode, a drain electrode and a gate electrode are formed and having a first through hole; an insulating film formed in contact with the semiconductor layer and having a second through hole; a first interconnection formed on the semiconductor layer through the first through hole and connected to one of the source electrode, the drain electrode and the gate electrode which is exposed in the first through hole; and a second interconnection formed on the insulating film through the second through hole and connected to another of the source electrode, the drain electrode and the gate electrode which is exposed in the second through hole. The first interconnection and the second interconnection face each other and form a microstrip line.

11 Claims, 6 Drawing Sheets

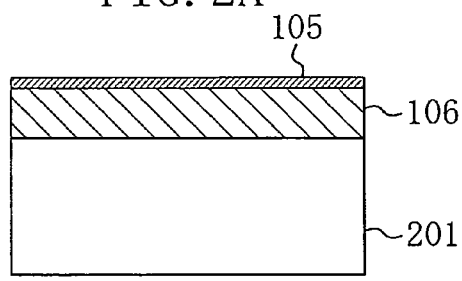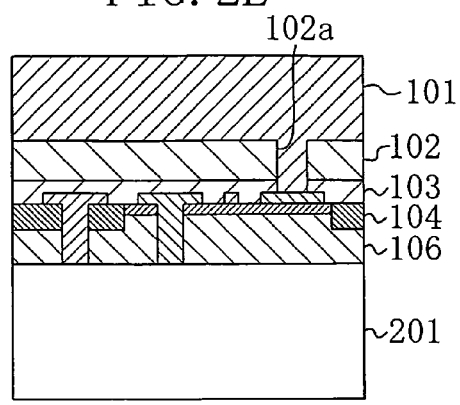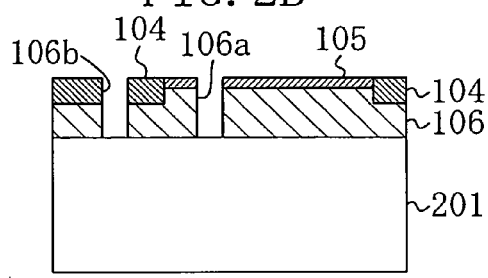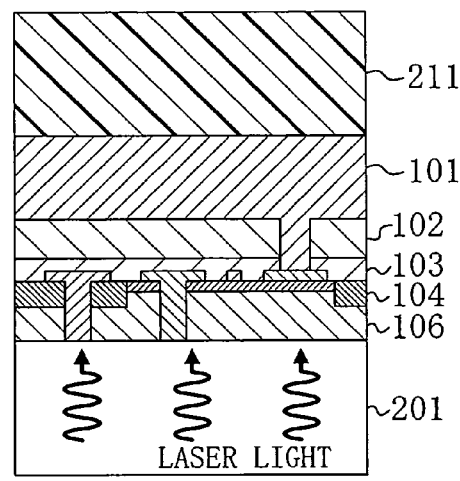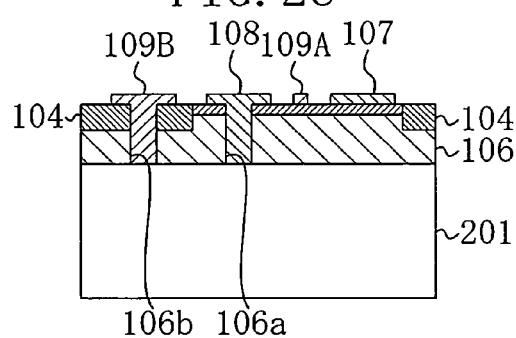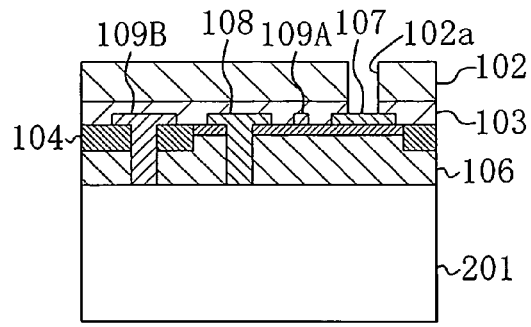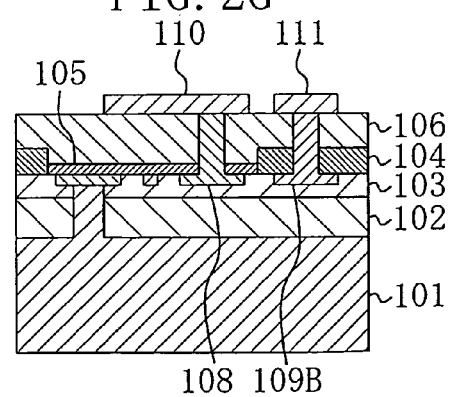

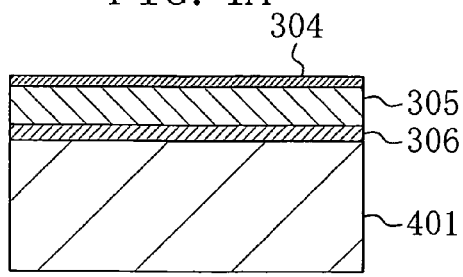
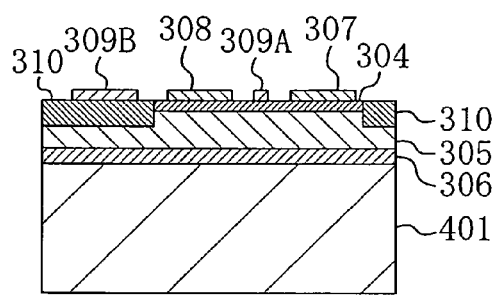
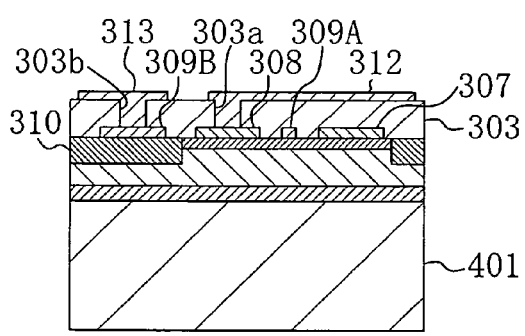
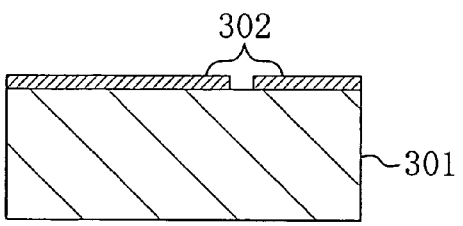
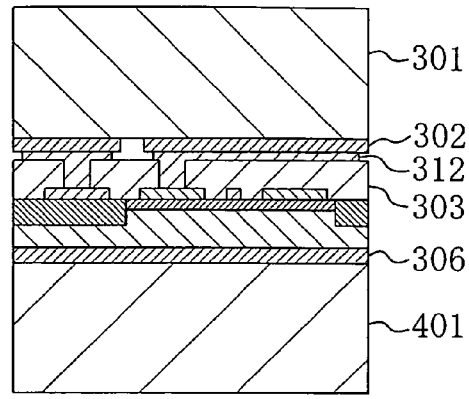
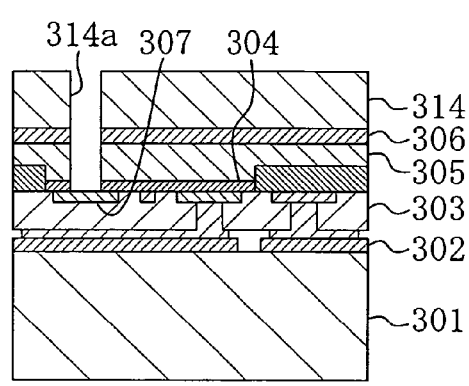
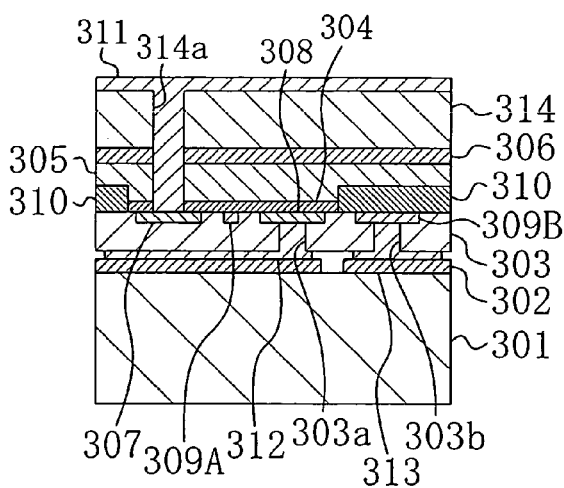

SEMICONDUCTOR INTEGRATED CIRCUIT DEVICE AND METHOD FOR FABRICATING THE SAME

CROSS-REFERENCE TO RELATED APPLICATION

The disclosure of Japanese Patent Application No. 2005-333860 filed in Japan on Nov. 18, 2005 including specification, drawings and claims is incorporated herein by reference in its entirety.

BACKGROUND OF THE INVENTION

The present invention relates to semiconductor integrated circuit devices including field effect transistors (FETs) using nitride semiconductor applicable to radio frequency (RF) transistors and methods for fabricating the devices.

Compound semiconductor of a Group-III nitride typified by gallium nitride (GaN) is wide-gap semiconductor having a large band gap and has characteristics of a dielectric strength higher than that of, for example, compound semiconductor such as gallium arsenide (GaAs) or semiconductor such as silicon (Si) and a high saturation drift speed of electrons. Accordingly, compound semiconductor has attracted attention for use in RF high-power transistors and has been intensively studied and developed.

As a result of studies in which the gate length is reduced to 0.18 μm and a recess structure is formed around a gate electrode so as to reduce parasitic resistance between a source electrode and a drain electrode, the maximum oscillation frequency $f_{max}$ is increased to 140 GHz (see, for example, T. Murata et al., IEEE Trans. Electron Devices, 52 (2005) 1042).

It is recently reported that the gate length is reduced to 60 nm so as to obtain a maximum oscillation frequency $f_{max}$ of 173 GHz in an FET (see, for example, M. Higashiwaki et al., Jpn. J. Appl. Phys., 44 (2005) L475). The use of such excellent RF characteristics enables application as a transistor and an integrated circuit for a submillimeter wave band in which the frequency is 20 GHz or more. In this frequency band, communication application using ultra wide band (UWB) radio communication is implementable and development into, for example, short-distance radar systems and other use is expected.

In this manner, in the case of applying nitride semiconductor hopefully expected for RF transistors to a frequency band of a submillimeter wave band or more, circuit integration including a passive element part is indispensable. In such an RF band, a configuration in which not a passive element such as an inductor or a capacitor but a so-called microstrip line formed by a metal film serving as a ground line on the entire back surface of, for example, a substrate and an metal interconnection formed on the surface of the substrate or a coplanar line formed by providing a ground line at each side of metal interconnection on a substrate, for example, is integrated as a passive element is generally adopted.

In a microstrip line, a ground line is formed on the back surface of a substrate so that the chip area is reduced. However, a process technique of connecting metal interconnection on the surface of the substrate and metal interconnection on the back surface thereof through a via hole penetrating the substrate needs to be established for a microstrip line. In the case of using a sapphire substrate widely used for crystal growth of nitride semiconductor, it generally difficult to process the sapphire substrate by dry etching, so that a through hole, i.e., a via hole, cannot be formed. Accordingly, a passive element is formed using a coplanar line, and an integrated circuit for a submillimeter wave band is implemented.

It is confirmed that a semiconductor integrated circuit device having the recess structure described above and formed by a two-stage amplifier in which an FET having a maximum oscillation frequency of 140 GHz and a coplanar line are integrated has a high gain of 13 dB at an operation frequency of 21.6 GHz and exhibits wide-band operation and low distortion (see, for example, M. Nishijima et al., 2005 IEEE MTT-S IMS Digest, Session TU4B).

In each of the conventional semiconductor integrated circuit devices including GaN-based FETs described above, however, the coplanar line is used and the ground line is formed on the surface of a chip, so that the problem of limitation on reduction of the chip area arises.

In addition, ground lines provided at both sides of metal interconnection have the same potential, so that other lines such as an air bridge structure needs to be provided. Accordingly, another problem in which the fabrication process becomes complicated arises.

Furthermore, since sapphire is used for a substrate for the growth of a nitride semiconductor layer, heat dissipation is not good and enhancement of electrical characteristics during high-power operation is limited.

SUMMARY OF THE INVENTION

It is therefore an object of the present invention to provide a semiconductor integrated circuit device in which a microstrip line is easily formed and a field effect transistor exhibiting excellent heat dissipation is included.

To achieve the object, according to the present invention, a semiconductor integrated circuit device has a structure in which a substrate for crystal growth is separated from a semiconductor layer and interconnections on the upper and lower faces of the semiconductor from which the substrate has been removed form a microstrip line. In this manner, a microstrip line is easily formed, thereby achieving size reduction of a chip. In addition, separation of the crystal growth substrate enables enhancement of heat dissipation.

Specifically, a through hole for exposing one of a source electrode, a drain electrode and a gate electrode is formed in a semiconductor layer and an insulating film formed on the semiconductor layer. Interconnections electrically connected to the electrodes through the through holes are provided to face each other with the semiconductor layer and the insulating film sandwiched therebetween, thereby forming a microstrip line. This microstrip line is combined as a passive element with at least one field effect transistor (FET), thereby forming a semiconductor integrated circuit device. In addition, since the semiconductor layer has been separated from a crystal growth substrate, so that it is unnecessary to provide a through hole for forming interconnection in the crystal growth substrate, and only providing a through hole in the semiconductor layer and the insulating film allows a microstrip line to be formed. Accordingly, an RF integrated circuit device with a small chip area is easily formed. Moreover, if a supporting substrate exhibiting excellent heat dissipation is bonded to the semiconductor layer from which the crystal growth substrate has been removed, a semiconductor integrated circuit device exhibiting excellent heat dissipation is implemented.

More specifically, a semiconductor integrated circuit device according to the present invention includes: a semiconductor layer having a principal surface on which a source electrode, a drain electrode and a gate electrode are formed and having a first through hole; a first insulating film formed in contact with the semiconductor layer and having a second through hole; a first interconnection formed on the semiconductor layer through the first through hole and connected to one of the source electrode, the drain electrode and the gate electrode which is exposed in the first through hole; and a second interconnection formed on the first insulating film through the second through hole and connected to another of the source electrode, the drain electrode and the gate electrode which is exposed in the second through hole, wherein the first interconnection and the second interconnection face each other and form a microstrip line.

In the semiconductor integrated circuit device of the present invention, the first interconnection is formed through the first through hole formed in the semiconductor layer and the second interconnection is formed through the second through hole formed in the first insulating film, thereby forming a microstrip line. Accordingly, the chip area is reduced. In addition, a through hole is formed only in the semiconductor layer and the first insulating film and no through holes need to be formed in a substrate for growing a semiconductor layer, so that fabrication processes are simplified.

The semiconductor integrated circuit device of the present invention further includes a supporting substrate made of a material exhibiting heat dissipation greater than the first interconnection and supporting the semiconductor layer with the first interconnection interposed between the supporting substrate and the semiconductor layer. Then, heat dissipation is enhanced by the supporting substrate exhibiting excellent heat dissipation, thus enabling high-power operation.

In this case, the supporting substrate may be made of one of silicon carbide (SiC) and aluminum nitride (AlN).

In the semiconductor integrated circuit device of the present invention, it is preferable that the second interconnection is a source line connected to the source electrode in the microstrip line, and the source line is made of one of gold plating, silver plating and copper plating. Then, a source line serving as a ground line exhibiting excellent heat dissipation is easily formed as intended.

In the semiconductor integrated circuit device of the present invention, it is preferable that the first interconnection is a source line connected to the source electrode in the microstrip line, and the semiconductor integrated circuit device further includes a supporting substrate made of conductive semiconductor and supporting the semiconductor layer with the source line interposed between the supporting substrate and the semiconductor layer. Then, if silicon is used for a supporting substrate made of, for example, conductive semiconductor, a semiconductor integrated circuit device capable of being easily processed at lower cost is implemented.

In this case, an electrode made of an alloy of gold and tin is preferably formed between the source line and the supporting substrate. The use of an alloy of gold and tin in this manner allows the semiconductor substrate and the semiconductor layer to be easily bonded together at a relatively low temperature.

In the semiconductor integrated circuit device of the present invention, it is preferable that the first insulating film is formed on the semiconductor layer to cover the source electrode, the drain electrode and the gate electrode, the semiconductor integrated circuit device further includes a second insulating film formed on a face of the semiconductor layer opposite the first insulating film, and the second insulating film has a third through hole connected to the first through hole in the semiconductor layer. Then, the second insulating film having a dielectric constant lower than that of semiconductor is interposed between the first interconnection and the second interconnection, thus implementing a microstrip line having a lower conductor loss.

In this case, each of the first and second insulating films preferably has a relative dielectric constant less than 3.9. Then, a gap between the first interconnection and the second interconnection forming a microstrip line is filled with an insulating film having a low dielectric constant, thus ensuring formation of a microstrip line having a lower conductor loss.

In this case, one of the first insulating film and the second insulating film is preferably made of benzo-cyclo-butene. The relative dielectric constant of benzo-cyclo-butene is as low as 2.5, thus ensuring reduction of a conductor loss.

In the semiconductor integrated circuit device of the present invention, it is preferable that a high-resistance region is formed in part of the semiconductor layer, and the first through hole penetrates the high-resistance region. Then, the gate electrode is connected to the first interconnection or the second interconnection through the through hole, so that the chip area is further reduced.

In the semiconductor integrated circuit device of the present invention, the semiconductor layer is preferably made of nitride semiconductor. Then, since nitride semiconductor has a high saturation drift speed, if the gate length is reduced, for example, an FET capable of operating at higher speed is implemented. In addition, since the dielectric strength is high, even if the device dimensions are reduced, the device has a high breakdown voltage and is operable with high power.

In this case, the semiconductor layer preferably includes a hetero junction between aluminum gallium nitride and gallium nitride. Then, a high sheet carrier concentration and a high mobility of carriers are achieved at the interface of hetero junction, thus implementing an FET having a lower parasitic resistance and operable at higher speed.

A method for fabricating a semiconductor integrated circuit device according to the present invention includes the steps of: (a) forming a semiconductor layer including a channel region on a substrate; (b) forming a source electrode, a drain electrode and a gate electrode on the semiconductor layer; (c) forming an insulating film on the semiconductor layer so that the insulating film covers the source electrode, the drain electrode and the gate electrode; (d) forming a first through hole in the semiconductor layer so that one of the source electrode, the drain electrode and the gate electrode is exposed in the first through hole; (e) forming a second through hole in the insulating film so that another of the source electrode, the drain electrode and the gate electrode is exposed in the second through hole; (f) forming a first interconnection on the insulating film through the second through hole so that the first interconnection is electrically connected to the electrode exposed in the second through hole; (g) separating the substrate from the semiconductor layer; and (h) forming a second interconnection on the semiconductor layer through the first through hole so that the second interconnection is electrically connected to the electrode exposed in the first through hole, wherein the first interconnection and the second interconnection face each other and form a microstrip line.

With the method for fabricating a semiconductor integrated circuit device according to the present invention, a semiconductor layer is separated from a substrate and a second interconnection formed in the semiconductor layer through a first through hole and a first interconnection formed in an insulating film through the second through hole form a microstrip line. Accordingly, the chip area is reduced. In addition, a through hole is formed only in the semiconductor layer and the insulating film covering the semiconductor layer and no through holes need to be formed in a substrate for growing the semiconductor layer, so that fabrication processes are simplified.

The method of the present invention preferably further includes the steps of: (i) forming an electrode pattern on a supporting substrate exhibiting heat dissipation greater than the first interconnection; and (j) bonding the supporting substrate and the insulating film together with the electrode pattern and the first interconnection interposed therebetween. Then, a semiconductor integrated circuit device exhibiting excellent heat dissipation and operable with high power is implemented.

The method of the present invention preferably further includes the steps of: (k) bonding a supporting material to the insulating film with the first interconnection interposed therebetween; (l) bonding a supporting substrate to the semiconductor layer with the second interconnection interposed therebetween; and (m) separating the supporting material from the insulating film after the step (l). Then, even if the thickness of the semiconductor layer is, for example, about several μm, the semiconductor layer from which the substrate has been removed is easily processed.

In this case, the supporting material is preferably a polymer film. Then, since the polymer film has high plasticity, thus ensuring bonding of even a large-area substrate (i.e., a wafer) without an influence of a warp of the semiconductor layer or the substrate.

In this case, the supporting substrate is preferably made of silicon. Then, the processibility of the supporting substrate is enhanced and the supporting substrate is formed at lower cost.

In the method of the present invention, it is preferable that in the step (g), a face of the substrate opposite the semiconductor layer is irradiated with light having a wavelength which is not absorbed in the substrate and is absorbed in part of the semiconductor layer so that part of the semiconductor layer is decomposed into a decomposed layer, thereby separating the substrate from the semiconductor layer. Then, the substrate and a semiconductor grown on the substrate are allowed to be separated from each other with high reproducibility even if the substrate has a large area.

In this case, a light source of the light is preferably laser light providing pulse oscillation. Then, output power of light for irradiation is greatly increased, so that the substrate is easily separated from the semiconductor layer.

In the method of the present invention, the semiconductor layer is preferably made of nitride semiconductor. Then, since nitride semiconductor has a high saturation drift speed, if the gate length is reduced, for example, an FET capable of operating at higher speed is implemented. In addition, since the dielectric strength is high, even if the device dimensions are reduced, the device has a high breakdown voltage and is operable with high power.

In this case, the substrate is preferably made of one of sapphire and silicon. Then, nitride semiconductor allows an epitaxial growth layer having excellent crystallinity, e.g., an epitaxial growth layer including a hetero junction of, for example, AlGaN and GaN, to be formed on sapphire or silicon, so that operation at higher speed with higher power is achieved.

BRIEF DESCRIPTION OF THE DRAWINGS

FIGS. 2A through 2G are views showing a method for fabricating a semiconductor integrated circuit device including an FET according to the first embodiment.

FIGS. 4A through 4G are views showing a method for fabricating a semiconductor integrated circuit device including an FET according to the second embodiment.

DETAILED DESCRIPTION OF THE INVENTION

Embodiment 1

A first embodiment of the present invention will be described with reference to the drawings.

Figure 1:
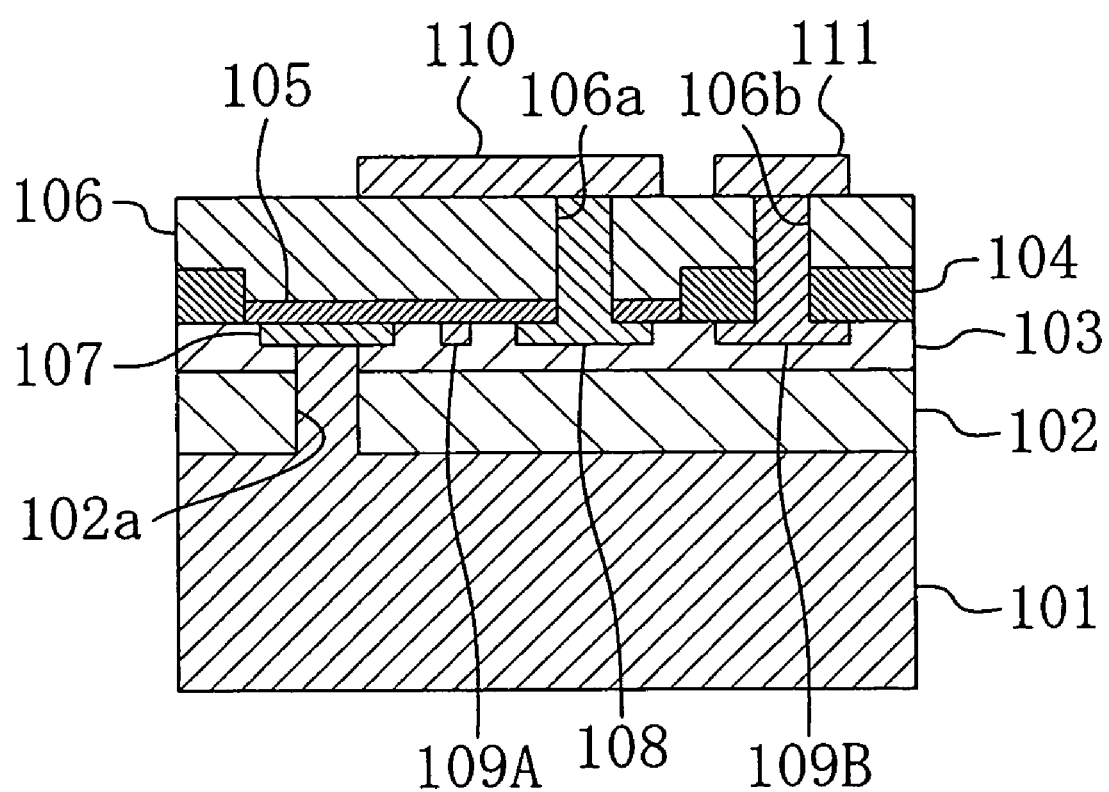
FIG. 1 is a cross-sectional view illustrating a semiconductor integrated circuit device including an FET according to a first embodiment of the present invention.

FIG. 1 is a cross-sectional view of a semiconductor integrated circuit device according to a first embodiment of the present invention. As illustrated in FIG. 1, an interlayer insulating film 102 made of benzo-cyclo-butene (BCB) with a thickness of about 3 μm, a passivation film 103 made of silicon nitride (SiN), a first semiconductor layer 105 made of n-type AlGaN and a second semiconductor layer 106 made of undoped GaN are sequentially formed on, for example, a source line 101 made of gold (Au) plating with a thickness of 10 μm or more.

A gate electrode 109A and source and drain electrodes 107 and 108 formed at both sides of the gate electrode 109A with spacing are formed on the lower face of the first semiconductor layer 105.

A first through hole 102a in which the source electrode 107 is exposed is formed in the interlayer insulating film 102 and the passivation film 103. In the first through hole 102a, the source line 101 is electrically connected to the source electrode 107.

A second through hole 106a in which the drain electrode 108 is exposed is formed in the first semiconductor layer 105 and the second semiconductor layer 106. The drain electrode 108 is also formed in the second through hole 106a.

A high-resistance region 104 formed to have a high resistance by, for example, selective oxidation or ion implantation is formed in the first semiconductor layer 105 and a lower portion of the second semiconductor layer 106 located outside the source and drain electrodes 107 and 108. A third through hole 106b penetrating the high-resistance region 104 and the second semiconductor layer 106 is formed in a portion of the high-resistance region 104 located outside the drain electrode 108. A gate pad electrode 109B electrically connected to the gate electrode 109A from the passivation film 103 is formed in the third through hole 106b.

A drain line 110 made of Au plating, covering the second through hole 106a and connected to the drain electrode 108 and a gate line 111 made of Au plating, covering the third through hole 106b and connected to the gate pad electrode 109B are formed on the second semiconductor layer 106.

In this manner, in the first embodiment, the drain line 110 and the gate line 111 formed on the second semiconductor layer 106 and the source line 101 formed below the first semiconductor layer 105 form a microstrip line, thereby forming a millimeter wave integrated circuit device combining the microstrip line with at least one field effect transistor (FET).

To enhance RF characteristics of the FET, a recess structure may be formed around the gate electrode 109A and a so-called cap layer formed by, for example, a stacked structure of low-resistance AlGaN and GaN or a quaternary mixed crystal layer of InAlGaN may be provided at both sides of the gate electrode 109A.

In the first embodiment, a crystal growth substrate for forming an epitaxial growth layer made of the second semiconductor layer 106 and the first semiconductor layer 105 has been separated and removed from the epitaxial growth layer, and the relatively-thick source line 101 made of Au plating is formed with the interlayer insulating film 102 interposed between the source line 101 and the epitaxial growth layer. In this manner, instead of the crystal growth substrate, the thick source line 101 is provided for the epitaxial growth layer, so that an FET exhibiting excellent heat dissipation is implemented.

The interlayer insulating film 102 made of benzo-cyclo-butene (BCB) has a relatively large thickness and BCB has a relative dielectric coefficient as small as about 2.5, so that parasitic capacitance on the microstrip line is reduced, thus implementing an FET having excellent RF characteristics. In addition, since BCB has a small relative dielectric constant, the line width of the microstrip line is large, so that a microstrip line having a smaller conductor loss is formed.

In the first embodiment, no through holes are provided in the crystal growth substrate whereas the through holes 106a and 106b are provided only in the epitaxial growth layer, so that a microstrip line is formed. In this manner, an RF integrated circuit having a small chip area is more easily formed.

Hereinafter, a method for fabricating a semiconductor integrated circuit device with the foregoing structure will be described with reference to the drawings.

FIGS. 2A through 2G illustrate cross-sectional structures in respective process steps of a method for fabricating a semiconductor integrated circuit device according to the first embodiment in the order of fabrication.

First, as shown in FIG. 2A, a second semiconductor layer 106 made of undoped GaN and a first semiconductor layer 105 made of n-type AlGaN are epitaxially grown in this order by, for example, a metal organic chemical vapor deposition (MOCVD) process on the principal surface of a substrate 201 made of sapphire (single crystal $Al_2O_3$). The first semiconductor layer 105 has an Al content of 26% and the entire part or a portion of the first semiconductor layer 105 is doped with silicon (Si) as an n-type dopant. At this time, the typical carrier concentration of the first semiconductor layer 105 is $4 \times 10^{13}$ cm$^{-3}$. In a case where the plane orientation of the principal surface of the substrate 201 is a (0001) plane, even if the (0001) plane which are the plane orientations of the second semiconductor layer 106 and the first semiconductor layer 105 formed on the principal surface of the substrate 201 is undoped under the influence of an internal electric field generated by polarization, a sheet carrier of about $1 \times 10^{13}$ cm$^{-3}$ occurs at the hetero interface. Accordingly, doping of the first semiconductor layer 105 is not always necessary. If the plane orientation of the principal surface of the substrate 201 is a (1-102) plane, i.e., a so-called R plane, the plane orientation of the principal surface of the second semiconductor layer 106 grown on this plane is a (1-20) plane. In the case of the (11-20) plane, no sheet carrier due to a polarized electric field or the polarization occurs, so that a normally-OFF FET, for example, is easily formed. The minus sign "−" added to the Miller indices for plane orientations of crystal planes represents inversion of an index following the minus sign for convenience.

Next, as shown in FIG. 2B, the first semiconductor layer 105 and an upper portion of the second semiconductor layer 106 are, for example, selectively oxidized or selectively doped with, for example, high-concentration boron (B) ions, thereby forming a high-resistance region 104. Thereafter, dry etching is selectively performed on the first semiconductor layer 105, the second semiconductor layer 106 and the high-resistance region 104 using, for example, inductively coupled plasma (ICP) etching, thereby forming second and third through holes 106a and 106b in which the substrate 201 is exposed. This dry etching stops at the substrate 201 and the depth of the through holes 106a and 106b is about 2 μm to 3 μm, for example.

Then, as shown in FIG. 2C, a source electrode 107, a drain electrode 108, a gate electrode 109A and a gate pad electrode 109B are formed on the first semiconductor layer 105 and the high-resistance region 104 by, for example, an electron beam deposition process or a lift-off process. Specifically, first, the second through hole 106a is filled with a laminated metal of titanium (Ti) and aluminum (Al) to form a drain electrode 108 on the first semiconductor layer 105 and a source electrode 107 is also formed on the first semiconductor layer 105 at a distance from the drain electrode 108. Then, the third through hole 106b is filled with palladium silicide (PdSi) to form a gate pad electrode 109B and a gate electrode 109A is formed between the source electrode 107 and the drain electrode 108. The formation of the source electrode 107 and the drain electrode 108 and the formation of the gate electrode 109A and the gate pad electrode 109B may be performed in any order. The through holes 106a and 106b are not necessarily filled with metals for electrode formation, and may be previously filled with, for example, gold (Au) by, for example, vacuum evaporation.

Thereafter, as shown in FIG. 2D, a passivation film 103 made of silicon nitride (SiN) with a thickness of, for example, 500 nm is formed by a plasma chemical vapor deposition (CVD) process. Subsequently, an interlayer insulating film 102 made of benzo-cyclo-butene (BCB) is formed by a coating process on the passivation film 103 to a thickness of, for example, about 3 μm. Then, a first through hole 102a in which the source electrode 107 is exposed is selectively formed in the interlayer insulating film 102 and the passivation film 103.

Subsequently, as shown in FIG. 2E, a source line 101 made of Au with a thickness of at least 10 μm is formed by a gold plating process over the entire surface of the interlayer insulating film 102 including the first through hole 102a. The source line 101 is not limited to gold plating, and silver (Ag) plating or copper (Cu) plating may be used.

Then, as shown in FIG. 2F, a supporting material 211 of a polymer film with a thickness of about 100 μm is bonded to the source line 101. The polymer film is made of polyester and adheres to the source line 101 with an adhesive which froths upon application of heat, for example, to lose its adhesive property sandwiched therebetween. Subsequently, the face of the substrate 201 opposite the second semiconductor layer 106 is irradiated with KrF excimer laser light producing pulse oscillation at a wavelength of 248 nm, while being scanned in the in-plane orientation of the substrate 201 with the laser light. At this time, the applied laser light is not absorbed in the substrate 201 but is absorbed only in the second semiconductor layer 106 and heat is locally generated in a portion of the second semiconductor layer 106 near the interface between the second semiconductor layer 106 and the substrate 201, thereby breaking the bond between the second semiconductor layer 106 and the substrate 201. Accordingly, the substrate 201 is easily separated from the second semiconductor layer 106, thus obtaining a GaN-based transistor structure from which the substrate 201 for epitaxial growth is removed. The light source is not limited to KrF excimer laser light, and third-harmonic light of yttrium-aluminum-garnet (YAG) laser having a wavelength of 355 nm or an emission line of a mercury lamp having a wavelength of 365 nm may be used. The substrate 201 may be removed by polishing.

Then, as shown in FIG. 2G, the supporting material 211 is heated to, for example, 150° C., thereby removing the supporting material 211 from the source line 101. Thereafter, a drain line 110 connected to the drain electrode 108 and a gate line 111 connected to the gate pad electrode 109B are formed by a gold plating process on the face of the second semiconductor layer 106 opposite the first semiconductor layer 105, i.e., the face of the second semiconductor layer 106 exposed after the removal of the substrate 201.

As described above, in the first embodiment, the substrate 201 made of sapphire having a low thermal conductivity is removed from the epitaxial growth layer, and the source line 101 made of a thick metal and the gate line 111, for example, form a microstrip line with the first semiconductor layer 105 therebetween. In this manner, it is unnecessary to provide a through hole for a microstrip line in the sapphire substrate 201 which is difficult to process. Accordingly, an FET exhibiting excellent heat dissipation and RF characteristics is easily implemented with a smaller chip area.

Embodiment 2

Hereinafter, a second embodiment of the present invention will be described with reference to the drawings.

Figure 3:
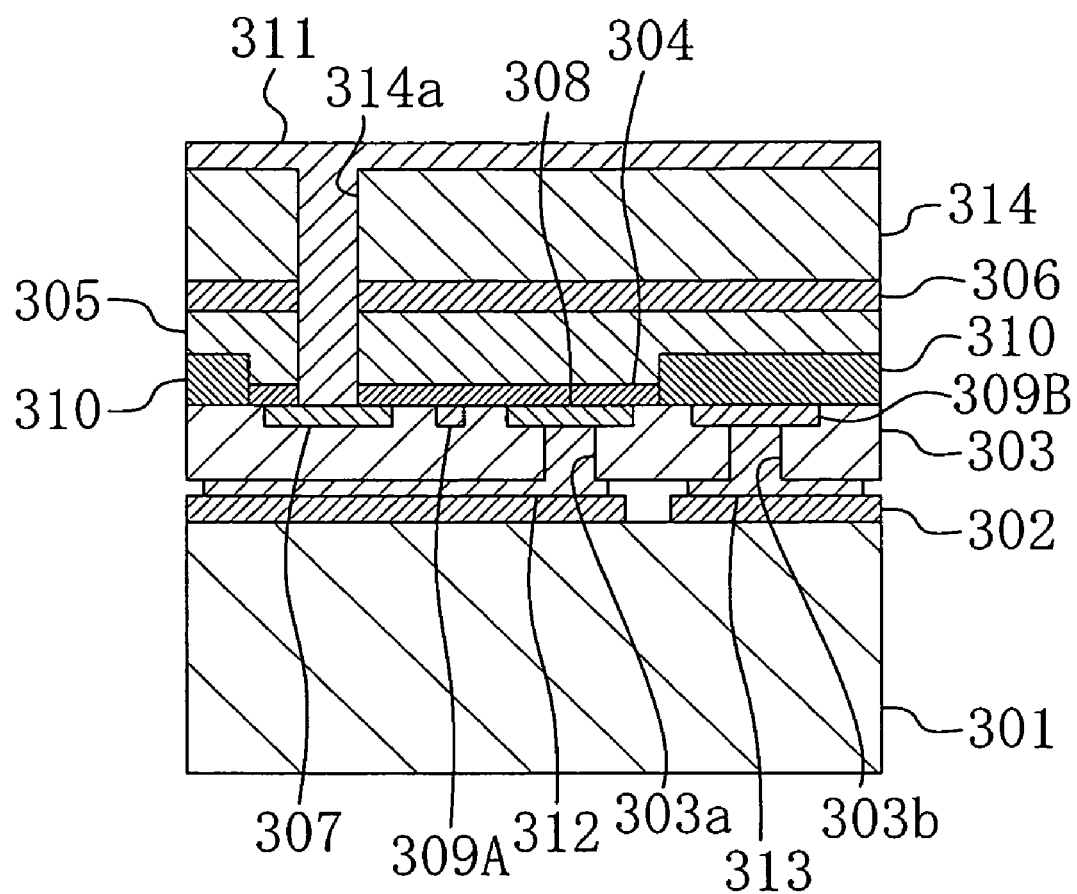
FIG. 3 is a cross-sectional view illustrating a semiconductor integrated circuit device including an FET according to a second embodiment of the present invention.

FIG. 3 illustrates a cross-sectional structure of a semiconductor integrated circuit device according to the second embodiment. As illustrated in FIG. 3, a passivation film 303 made of silicon nitride (SiN) is bonded to a supporting substrate 301 made of, for example, semi-insulating silicon carbide (SiC) with a thickness of 150 μm or more with an electrode pattern 302 of gold (Au)/gold tin (AuSn)/gold (Au), a drain line 312 and a gate line 313 sandwiched therebetween.

A first semiconductor layer 304 made of n-type AlGaN, a second semiconductor layer 305 made of undoped GaN, a buffer layer 306 made of AlN, an interlayer insulating film 314 made of benzo-cyclo-butene (BCB) with a thickness of about 3 μm and a source line 311 are sequentially formed on the passivation film 303.

A gate electrode 309A is formed on the lower face of the first semiconductor layer 304 and a source electrode 307 and a drain electrode 308 are formed at both sides of the gate electrode 309A with spacing on the lower face of the first semiconductor layer 304.

A high-resistance region 310 formed to have a high resistance by, for example, selective oxidation or ion implantation is formed in the first semiconductor layer 304 and a lower portion of the second semiconductor layer 305 located outside the source and drain electrodes 307 and 308. A gate pad electrode 309B electrically connected to the gate electrode 309A is formed on the lower face of the high-resistance region 310 with the drain electrode 308 sandwiched between the gate pad electrode 309B and the gate electrode 309A.

A first through hole 303a and a second through hole 303b in which the drain electrode 308 and the gate pad electrode 309B, respectively, are exposed are formed in the passivation film 303. The drain line 312 is electrically connected to the drain electrode 308 in the first through hole 303a. The gate line 313 is electrically connected to the gate pad electrode 309B in the second through hole 303b.

A third through hole 314a in which the source electrode 307 is exposed is formed through the first semiconductor layer 304, the second semiconductor layer 305, the buffer layer 306 and the interlayer insulating film 314. The source line 311 is electrically connected to the source electrode 307 in the third through hole 314a.

In this embodiment, the electrode pattern 302 extends to outside the supporting substrate 301, thus obtaining an operable FET. Examples of a method for extending the electrode pattern 302 includes a method in which the area of the supporting substrate 301 is set smaller than that of an epitaxial growth layer including the first semiconductor layer 304 to provide an extended portion of the electrode pattern 302 and a method in which a fourth through hole is formed in the supporting substrate 301 to form an electrode pattern on the face of the supporting substrate 301 opposite the electrode pattern 302.

In this manner, in the second embodiment, the drain line 312 or the gate line 313 formed between the supporting substrate 301 and the passivation film 303 and the source line 311 facing the drain line 312 or the gate line 313 with the first semiconductor layer 304 and the second semiconductor layer 305 sandwiched therebetween form a microstrip line. This microstrip line is combined with at least one FET, thereby forming a millimeter wave integrated circuit.

The substrate for epitaxial growth is removed by a process described below and the interlayer insulating film 314 is formed for the epitaxial layer instead, so that a microstrip line is formed by providing the through hole 314a only in the epitaxial layer without providing a through hole in the epitaxial growth substrate. Accordingly, an RF integrated circuit with a small chip area is more easily fabricated.

If the thickness of the interlayer insulating film 314 made of benzo-cyclo-butene (BCB) is reduced, parasitic capacitance in the microstrip line and an FET is reduced, so that an FET having excellent RF characteristics is implemented.

Since BCB is a material having a low dielectric constant as described above, a microstrip line having a smaller conductor loss is formed.

Hereinafter, a method for fabricating a semiconductor integrated circuit device with the foregoing configuration will be described with reference to the drawings.

FIGS. 4A through 4G illustrate cross-sectional structures in respective process steps of a method for fabricating a semiconductor integrated circuit device according to the second embodiment in the order of fabrication.

First, as shown in FIG. 4A, a buffer layer 306 made of AlN, a second semiconductor layer 305 made of undoped GaN and a first semiconductor layer 304 made of n-type AlGaN are epitaxially grown in this order by, for example, an MOCVD process on the principal surface of a substrate 401 made of silicon (Si) whose principal surface has a plane orientation of a (111) plane. The buffer layer 306 is not limited to AlN, and may be made of, for example, a stacked structure of GaN and AlN or nitride semiconductor having an arbitrary composition including GaN as long as excellent GaN-based crystal is formed on the buffer layer 306.

Next, as shown in FIG. 4B, a high-resistance region 310 is selectively formed by, for example, selective oxidation or ion implantation in the first semiconductor layer 304 and an upper portion of the second semiconductor layer 305. Thereafter, a source electrode 307, a drain electrode 308, a gate electrode 309A and a gate pad electrode 309B are formed on the first semiconductor layer 304 and the high-resistance region 310 by, for example, an electron beam deposition process or a lift-off process. Specifically, first, a source electrode 307 and a drain electrode 308 are formed with spacing on the first semiconductor layer 304 out of a laminated metal of Ti and Al. Then, a gate pad electrode 309B made of PdSi is formed on the high-resistance region 310 and a gate electrode 309A is formed between the source electrode 307 and the drain electrode 308. The formation of the source electrode 307 and the drain electrode 308 and the formation of the gate electrode 309A and the gate pad electrode 309B may be performed in any order.

Then, as shown in FIG. 4C, a passivation film 303 made of SiN with a thickness of, for example, about 300 nm is formed by a plasma CVD process. Thereafter, using a reactive ion etching (RIE) process, a first through hole 303a and a second through hole 303b in which the drain electrode 308 and the gate pad electrode 309B, respectively, are exposed are formed in the passivation film 303. Subsequently, by a gold plating process, a drain line 312 and a gate line 313 are formed on the passivation film 303 to fill the first through hole 303a and the second through hole 303b, respectively.

Thereafter, as shown in FIG. 4D, a supporting substrate 301 made of semi-insulating SiC is prepared, and an electrode pattern 302 made of a stacked film of Au/AuSnlAu and having an interconnection pattern facing the drain line 312 and the gate line 313 is formed on the principal surface of the supporting substrate 301.

Subsequently, as shown in FIG. 4E, the electrode pattern 302 formed on the supporting substrate 301 and the passivation film 303 on which the drain line 312 and the gate line 313 are formed are placed to face each other, are brought into intimate contact with each other, and then are heated with pressure, thereby bonding the supporting substrate 301 to the passivation film 303.

Then, as shown in FIG. 4F, the substrate 401 made of Si is selectively removed with a solution as a mixture of, for example, hydrofluoric acid (HF) and nitric acid (HNO$_3$). Thereafter, an interlayer insulating film 314 made of BCB is formed by a coating process on the buffer layer 306 exposed after the removal of the substrate 401. Subsequently, a third through hole 314a in which the source electrode 307 is exposed is formed through the interlayer insulating film 314, the buffer layer 306, the second semiconductor layer 305 and the first semiconductor layer 304 by dry etching such as ICP etching.

Thereafter, as shown in FIG. 4G, a source line 311 made of Au is formed on the entire surface of the interlayer insulating film 314 including the third through hole 314a by a gold plating process. The source line 311 is not limited to gold plating, and Ag plating or Cu plating may be used.

As described above, in the second embodiment, the Si substrate 401 for epitaxial growth is removed and the high-resistance region 310 made of SiC having a high thermal conductivity is attached. In addition, a microstrip line is formed by, for example, the gate line 313 on the passivation film 303 with the interlayer insulating film 314 sandwiched therebetween. In this manner, an FET exhibiting excellent heat dissipation and RF characteristics is easily implemented with a smaller chip area.

Since BCB having a low dielectric constant is used for the interlayer insulating film 314, a conductor loss in the microstrip line is reduced.

Embodiment 3

Hereinafter, a third embodiment of the present invention will be described with reference to the drawings.

Figure 5:
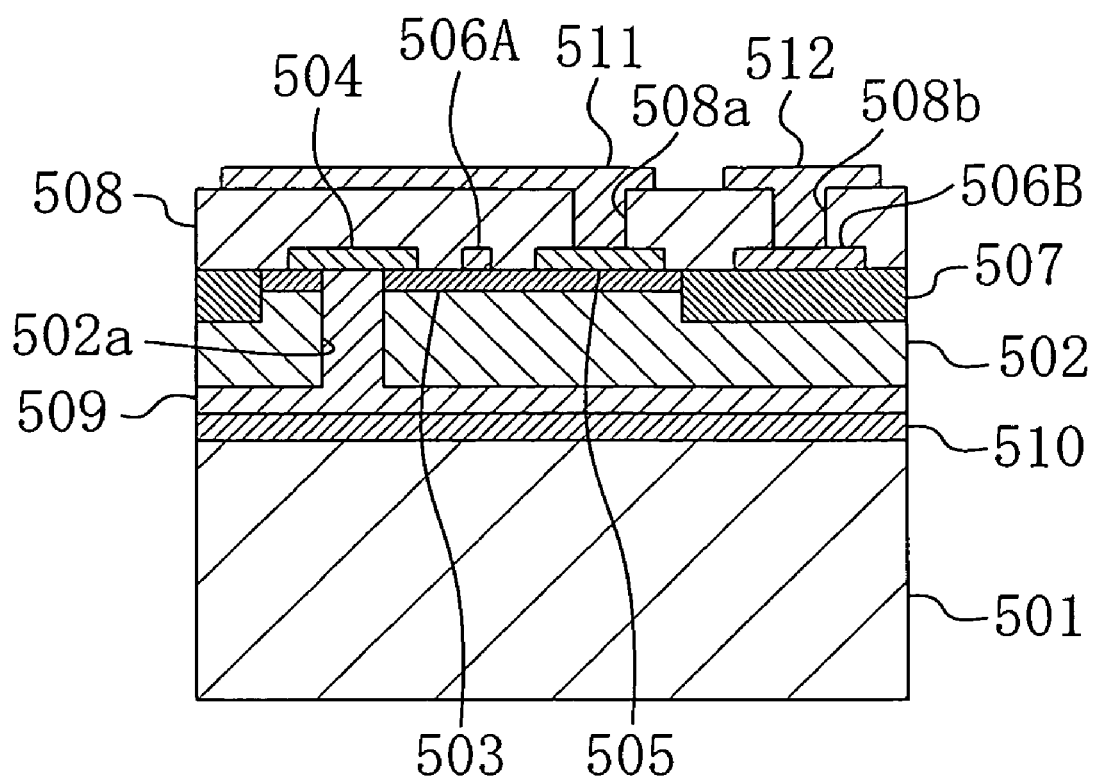
FIG. 5 is a cross-sectional view illustrating a semiconductor integrated circuit device including an FET according to a third embodiment of the present invention.

FIG. 5 illustrates a cross-sectional structure of a semiconductor integrated circuit device according to the third embodiment. As illustrated in FIG. 5, a first semiconductor layer 502 made of undoped GaN and a second semiconductor layer 503 made of n-type AlGaN are attached to a supporting substrate 501 having a thickness of, for example, 150 µm or more and made of silicon (Si) whose principal surface has a plane orientation of a (100) plane with an electrode pattern 510 made of Au/AuSn/Au and a source line 509 sandwiched therebetween.

A gate electrode 506A is formed on the second semiconductor layer 503 and a source electrode 504 and a drain electrode 505 are formed at both sides of the gate electrode 506A with spacing on the second semiconductor layer 503.

A high-resistance region 507 formed to have a high resistance by, for example, selective oxidation or ion implantation is formed in an upper portion of the first semiconductor layer 502 and a portion of the second semiconductor layer 503 located outside the source and drain electrodes 504 and 505. A gate pad electrode 506B electrically connected to the gate electrode 506A is formed on the high-resistance region 507 with the drain electrode 505 sandwiched between the gate pad electrode 506B and the gate electrode 506A.

A first through hole 502a in which the source electrode 504 is exposed is formed in the first semiconductor layer 502. The source line 509 is electrically connected to the source electrode 504 in the first through hole 502a.

A passivation film 508 made of SiN is formed on the second semiconductor layer 503 to cover the source electrode 504, the drain electrode 505, the gate electrode 506A and the gate pad electrode 506B. A second through hole 508a and a third through hole 508b in which the drain electrode 505 and the gate pad electrode 506B, respectively, are exposed are formed in the passivation film 508. A drain line 511 is electrically connected to the drain electrode 505 in the second through hole 508a. A gate line 512 is electrically connected to the gate pad electrode 506B in the third through hole 508b.

In this manner, in the third embodiment, the source line 509 formed between the supporting substrate 501 and the first semiconductor layer 502 and the drain line 511 or the gate line 512 facing the source line 509 with the passivation film 508 sandwiched therebetween form a microstrip line. This microstrip line is combined with at least one FET, thereby forming a millimeter wave integrated circuit.

The substrate for epitaxial growth is removed by a process described below and the supporting substrate 501 exhibiting better heat dissipation is attached instead, so that a microstrip line is formed only by providing the through hole 502a only in the epitaxial layer without providing a through hole in the epitaxial growth substrate. Accordingly, an RF integrated circuit with a small chip area is more easily fabricated.

Hereinafter, a method for fabricating a semiconductor integrated circuit device with the foregoing structure will be described with reference to the drawings.

FIGS. 6A through 6H illustrate cross-sectional structures in respective process steps of a method for fabricating a semiconductor integrated circuit device according to the third embodiment in the order of fabrication.

Figure 6A:
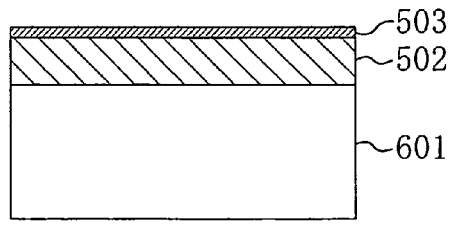
FIGS. 6A through 6H are views showing a method for fabricating a semiconductor integrated circuit device including an FET according to the third embodiment.

First, as shown in FIG. 6A, a first semiconductor layer 502 made of undoped GaN and a second semiconductor layer 503 made of n-type AlGaN are epitaxially grown in this order by, for example, an MOCVD process on the principal surface of a substrate 601 made of sapphire.

Figure 6B:
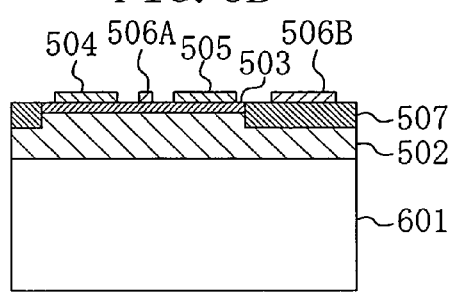

Next, as shown in FIG. 6B, a high-resistance region 507 is selectively formed by, for example, selective oxidation or ion implantation in an upper portion of the first semiconductor layer 502 and the second semiconductor layer 503. Thereafter, a source electrode 504, a drain electrode 505, a gate electrode 506A and a gate pad electrode 506B are formed on the second semiconductor layer 503 and the high-resistance region 507 by, for example, an electron beam deposition process or a lift-off process. Specifically, first, a source electrode 504 and a drain electrode 505 are formed with spacing on the second semiconductor layer 503 out of a laminated metal of Ti and Al. Then, a gate pad electrode 506B of PdSi is formed on the high-resistance region 507 and a gate electrode 506A is formed between the source electrode 504 and the drain electrode 505. The formation of the source electrode 504 and the drain electrode 505 and the formation of the gate electrode 506A and the gate pad electrode 506B may be performed in any order.

Figure 6C:
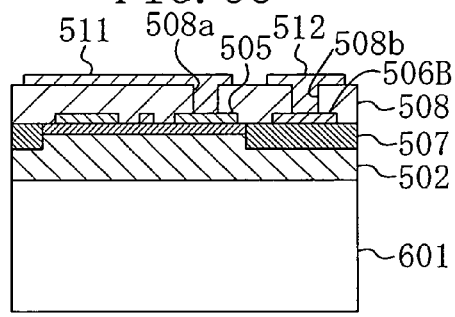

Then, as shown in FIG. 6C, a passivation film 508 made of SiN with a thickness of, for example, about 300 nm is formed by a plasma CVD process. Thereafter, using a reactive ion etching (RIE) process, for example, a second through hole 508a and a third through hole 508b in which the drain electrode 505 and the gate pad electrode 506B, respectively, are exposed are formed in the passivation film 508. Subsequently, by a gold plating process, a drain line 511 and a gate line 512 are formed on the passivation film 508 to fill the second through hole 508a and the third through hole 508b, respectively.

Figure 6D:
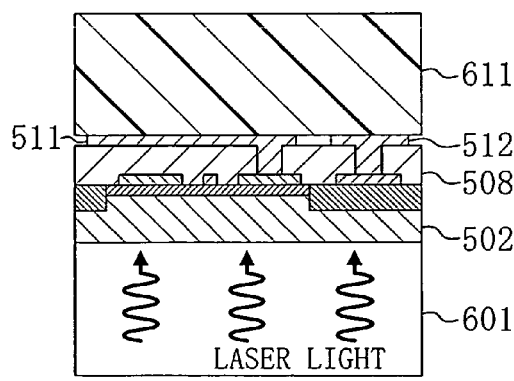

Then, as shown in FIG. 6D, a supporting material 611 of a polymer film with a thickness of about 100 μm is bonded to the passivation film 508 on which the drain line 511 and the gate line 512 are formed. The polymer film is made of polyester and adheres to the lines 511 and 512 and the passivation film 508 with an adhesive which froths upon application of heat, for example, to lose its adhesive property sandwiched therebetween. Subsequently, the face of the substrate 601 opposite the first semiconductor layer 502 is irradiated with KrF excimer laser light producing pulse oscillation at a wavelength of 248 nm, while being scanned in the in-plane orientation of the substrate 601 with the laser light. The irradiation with this laser light breaks the bond between the first semiconductor layer 502 and the substrate 601. Accordingly, the substrate 601 is separated from the first semiconductor layer 502. The light source is not limited to KrF excimer laser light, and third-harmonic light of YAG laser or an emission line of a mercury lamp may be used. The substrate 601 may be removed by polishing.

Figure 6E:
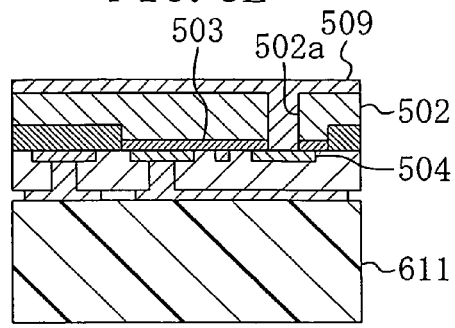

Then, as shown in FIG. 6E, dry etching such as ICP etching is performed on the first semiconductor layer 502 from which the substrate 601 has been removed and on the second semiconductor layer 503, thereby forming a first through hole 502a in which the source electrode 504 is exposed. Subsequently, a source line 509 made of Au is formed on the entire surface of the first semiconductor layer 502 including the first through hole 502a by a gold plating process. The source line 509 is not limited to gold plating, and Ag plating or Cu plating may be used.

Figure 6F:
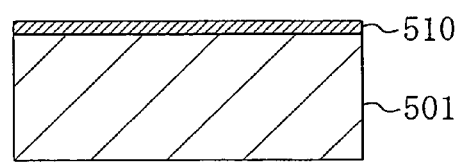

Thereafter, as shown in FIG. 6F, a supporting substrate 501 made of silicon (Si) whose principal surface has a plane orientation of a (100) plane is prepared, and an electrode pattern 510 made of a stacked film of Au/AuSn/Au is formed on the principal surface of the supporting substrate 501. The supporting substrate 501 made of Si may have conductivity.

Figure 6G:
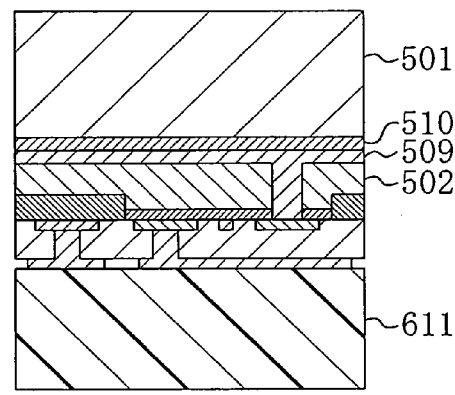

Subsequently, as shown in FIG. 6G, the electrode pattern 510 formed on the supporting substrate 501 and the first semiconductor layer 502 on which the source line 509 is formed are placed to face each other, are brought into intimate contact with each other, and then are heated with pressure, thereby bonding the supporting substrate 501 to the first semiconductor layer 502.

Figure 6H:
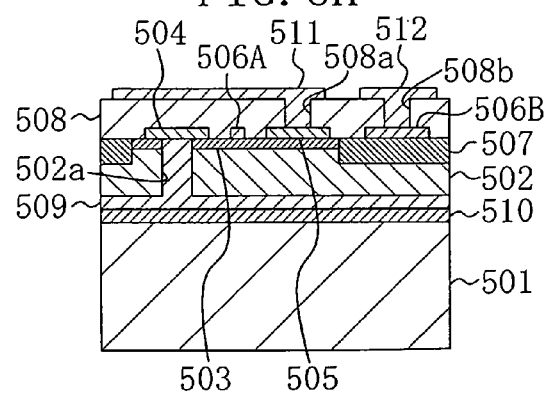

Then, as shown in FIG. 6H, a supporting material 611 is heated to, for example, 150° C., thereby removing the supporting material 611 from the passivation film 508.

As described above, in the third embodiment, the substrate 601 made of sapphire having a low thermal conductivity is removed from the epitaxial semiconductor layer and the source line 509 and the gate line 512, for example, form a microstrip line with the first semiconductor layer 502 sandwiched therebetween. In this manner, it is unnecessary to provide a through hole for a microstrip line in the sapphire substrate 601 which is difficult to process. Accordingly, an FET exhibiting excellent heat dissipation and RF characteristics is easily implemented with a smaller chip area.

In the first and third embodiments, the plane orientations of the principal surfaces of the sapphire substrates 201 and 601 for epitaxial growth are not specifically limited. For example, the plane orientations may have an off angle slightly inclined from a typical plane such as a (0001) plane. Especially in the case of GaN-based semiconductor, if a nonpolar plane such as a (11-20) plane or a (1-100) plane is used as the plane orientation of the principal surface, the influence of polarization does not occur, so that a normally-OFF FET is easily configured and, thus, is effective as a power switching device.

In the same manner, in the second embodiment, the plane orientation of the principal surface of the silicon substrate 401 for epitaxial growth is not specifically limited. For example, the plane orientation may have an off angle slightly inclined from a typical plane such as a (111) plane.

In the foregoing embodiments, instead of sapphire and silicon, the substrates 201, 401 and 601 for epitaxial growth may be made of silicon carbide (SiC), zinc oxide (ZnO), gallium arsenide (GaAs), gallium phosphorus (GaP), indium phosphorus (InP) or $LiAl_xGa_{1-x}O_2$ (where $0 \leq x \leq 1$).

In the foregoing embodiments, an epitaxial growth layer including the first semiconductor layer and the second semiconductor layer may have an arbitrary composition or an arbitrary multilayer structure as long as desired transistor characteristics are obtained. For example, the epitaxial growth layer may contain a Group-V element such as arsenic (As) or phosphorus (P) or a Group-III element such as boron (B).

The crystal growth method for the epitaxial growth layer is not limited to an MOCVD method, and a molecular beam epitaxy (MBE) process or a hydride vapor phase epitaxy (HVPE) process may be used.

As described above, a semiconductor integrated circuit device according to the present invention is useful as, for example, a semiconductor integrated circuit device including an RF transistor forming a car-mounted radar used as, for example, a submillimeter wave band radar system or a transmitting/receiving circuit used in, for example, a base of cellular phones.

What is claimed is:

1. A semiconductor integrated circuit device, comprising:
a first semiconductor layer having a first surface on which a source electrode, a drain electrode and a gate electrode are formed and having a first through hole;
a second semiconductor layer formed on said first semiconductor layer, said first through hole extending through said second semiconductor layer,
a first insulating film formed in contact with the first semiconductor layer and having a second through hole;
a first metal electrode formed on a first surface of the second semiconductor layer and directly connected to the gate electrode through a metal which fills the first through hole; and a second metal electrode formed on the first insulating film and directly connected to the source electrode through a metal which fills the second through hole, wherein the first metal electrode and the second metal electrode face each other, the second metal electrode is a ground plane and the first metal electrode is a transmission line for a signal of the integrated circuit, and the first metal electrode and the second metal electrode form a microstrip line, and a high resistance region is formed in the first semiconductor layer and the second semiconductor layer between the second semiconductor layer and the first insulating film.

2. The semiconductor integrated circuit device of claim 1, wherein the source line is made of one of gold plating, silver plating and copper plating.

3. The semiconductor integrated circuit device of claim 1, wherein the first insulating film has a relative dielectric constant less than 3.9.

4. The semiconductor integrated circuit device of claim 3, wherein the first insulating film is made of benzo-cyclobutene.

5. The semiconductor integrated circuit device of claim 1 wherein the first through hole penetrates the high-resistance region.

6. The semiconductor integrated circuit device of claim 1, wherein the first semiconductor layer is made of nitride semiconductor.

7. The semiconductor integrated circuit device of claim 6, wherein the first semiconductor layer includes a hetero junction between aluminum gallium nitride and gallium nitride.

8. A semiconductor integrated circuit device, comprising:
a first semiconductor layer having a first surface on which a source electrode, a drain electrode and a gate electrode are formed and having a first through hole;

a second semiconductor layer formed on said first semiconductor layer, said first through hole extending through said second semiconductor layer;

a first insulating film formed in contact with the first semiconductor layer and having a second through hole;

a first metal electrode formed on a first surface of the second semiconductor layer and directly connected to the gate electrode through a metal which fills the first through hole; and a second metal electrode formed on the first insulating film and directly connected to one of the source electrode, the drain electrode or the gate electrode through a metal which fills the second hole, which is different from the source electrode, the drain electrode or the gate electrode which is connected to the first metal electrode, wherein:

the first metal electrode and the second metal electrode face each other, the second metal electrode is a ground plane and the first metal electrode is a transmission line for a signal of the integrated circuit, and the first metal electrode and the second metal electrode forms a microstrip line, and a high resistance region is formed in the first semiconductor layer and the second semiconductor layer between the second semiconductor layer and the first insulating film.

9. The semiconductor integrated circuit device of claim 8, wherein the source line is made of gold plating, silver plating and copper plating.

10. The semiconductor integrated circuit device of claim 1, wherein the second semiconductor layer is undoped.

11. The semiconductor integrated circuit device of claim 8, wherein the second semiconductor layer is undoped.

* * * * *